(12) United States Patent
Cong et al.

(10) Patent No.: US 9,673,816 B2
(45) Date of Patent: Jun. 6, 2017

(54) ASYMMETRIC GATE DRIVER APPARATUS, METHODS, AND SYSTEMS

(71) Applicant: Halliburton Energy Services, Inc., Houston, TX (US)

(72) Inventors: Steven Cong, The Woodlands, TX (US); Thomas Jones, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/781,448

(22) PCT Filed: Nov. 11, 2014

(86) PCT No.: PCT/US2014/065008
§ 371 (c)(1),
(2) Date: Sep. 30, 2015

(87) PCT Pub. No.: WO2016/076840
PCT Pub. Date: May 19, 2016

(65) Prior Publication Data
US 2016/0301409 A1    Oct. 13, 2016

(51) Int. Cl.
*H03K 17/691*    (2006.01)
*E21B 47/12*    (2012.01)
(Continued)

(52) U.S. Cl.
CPC .......... *H03K 17/691* (2013.01); *E21B 47/12* (2013.01); *E21B 49/00* (2013.01); *G05G 1/10* (2013.01);
(Continued)

(58) Field of Classification Search
CPC .................. H03K 17/691; H03K 5/08; H03K 2217/0045; E21B 47/12; E21B 49/00; G05G 1/10; H02M 1/088; H02M 7/5387
(Continued)

(56) References Cited

U.S. PATENT DOCUMENTS 3,919,656 A    11/1975 Sokal et al.
4,115,708 A    9/1978 Liu
(Continued)

FOREIGN PATENT DOCUMENTS

| EP | 1201025 B1 | 9/2009 |
|---|---|---|
| EP | 2434644 A1 | 3/2012 |
| GB | 2240893 A | 8/1991 |

OTHER PUBLICATIONS

"International Application Serial No. PCT/US2014/065008, International Search Report Jul. 27, 2015", 3 pgs.
(Continued)

*Primary Examiner* — Brandon S Cole (57) ABSTRACT

In some embodiments, an apparatus and a system, as well as a method and an article, may operate to transform a first control signal to produce an isolated second control signal, to receive a pair of floating power supply voltages at opposing ends of a totem-pole series of driver metal-oxide semiconductor field-effect transistors (MOSFETs), and to clamp an output of a driver apparatus to one of the pair of floating power supply voltages. The isolated second control signal may operate to control current flow through the driver MOSFETs. Additional apparatus, systems, and methods are described.

20 Claims, 8 Drawing Sheets

(51) Int. Cl.
  *E21B 49/00* (2006.01)
  *G05G 1/10* (2006.01)
  *H02M 1/088* (2006.01)
  *H02M 7/5387* (2007.01)
  *H03K 5/08* (2006.01)

(52) U.S. Cl.
  CPC ......... *H02M 1/088* (2013.01); *H02M 7/5387* (2013.01); *H03K 5/08* (2013.01); *H03K 2217/0045* (2013.01)

(58) Field of Classification Search
  USPC ............. 327/108–112, 365–508; 326/22–27, 326/81–87
  See application file for complete search history.

(56) References Cited

U.S. PATENT DOCUMENTS

| | | | |
|---|---|---|---|
| 4,733,194 A | | 3/1988 | Roehrs |
| 4,748,532 A | * | 5/1988 | Commander ....... H02M 7/5387 323/289 |
| 5,019,719 A | | 5/1991 | King |
| 5,923,548 A | | 7/1999 | Kammiller |
| 6,107,860 A | | 8/2000 | Vinciarelli |
| 6,294,957 B1 | * | 9/2001 | Luu ...................... H03F 3/2171 330/10 |
| 6,556,053 B2 | | 4/2003 | Stanley |
| 6,844,779 B2 | | 1/2005 | McEwen |
| 8,095,710 B2 | | 1/2012 | Landry et al. |
| 8,367,481 B2 | | 2/2013 | Liu et al. |
| 8,531,226 B2 | | 9/2013 | Montalbo et al. |
| 8,588,338 B2 | | 11/2013 | Wojtiuk |
| 8,643,347 B2 | | 2/2014 | Giuliano et al. |
| 8,643,407 B2 | | 2/2014 | Reese et al. |
| 8,717,076 B1 | | 5/2014 | Shook |
| 9,425,622 B2 | * | 8/2016 | Deboy .................... H02J 3/383 |
| 2003/0156439 A1 | * | 8/2003 | Ohmichi .............. H02M 7/538 363/98 |
| 2008/0116752 A1 | * | 5/2008 | Kuroda .............. G07C 9/00309 307/125 |
| 2010/0165664 A1 | | 7/2010 | Terashi |
| 2011/0090719 A1 | | 4/2011 | Benjamin |
| 2013/0063184 A1 | * | 3/2013 | Liang .................. H01L 21/8213 327/108 |
| 2013/0170264 A1 | | 7/2013 | Divan et al. |
| 2013/0187684 A1 | | 7/2013 | Gangopadhya |
| 2013/0234695 A1 | | 9/2013 | Shook |

OTHER PUBLICATIONS

"International Application Serial PCT/US2014/065008, Written Opinion mailed Jul. 27, 2015", 4 pgs.

Berning, D.W., et al., "High-Voltage Isolated Gate Drive Circuit for 10 kv, 100 A SiC MOSFET/JBS Power Modules", IEEE Industry Applications Society Annual Meeting, 2008. (IAS '08), (2008), 1-7.

Callanan, Bob, "Application Considerations for Silicon Carbide MOSFETs", [online]. [retrieved on May 19, 2013] Retrieved from the Internet: <URL: http://www.cree.com/~/media/Files/Cree/Power/.../CPWRAN12.pdf, (Jan. 2011), 6 pgs.

Grigorjevs, Aleksejs, "Gate driver design for normally-off SIC JFET", [online]. [retrieved on May 19, 2014]. Retrieved from the Internet: <URL: http://www.diva-portal.org/smash/get/diva2:441765/FULLTEXT01.pdf>, Thesis, Master of Science in Electric Power Engineering, Norwegian University of Science and Technology, (Jul. 2011), 166 pgs.

* cited by examiner

ASYMMETRIC GATE DRIVER APPARATUS, METHODS, AND SYSTEMS

PRIORITY APPLICATIONS

This application is a U.S. National Stage Filing under 35 U.S.C. 371 from International Application No. PCT/US2014/065008, filed on 11 Nov. 2014; which application is incorporated herein by reference in its entirety.

BACKGROUND

Understanding the structure and properties of geological formations can reduce the cost of drilling wells for oil and gas exploration. Measurements made in a borehole (i.e., down hole measurements) are typically performed to attain this understanding, to identify the composition and distribution of material that surrounds the measurement device down hole. A variety of devices may be used to make such measurements, including transducers. For example, compressional wave velocity measurements can be made using ultrasound transducers, and resistivity measurements can be made using antennas. Sometimes power must be applied in a controlled manner to these transducers, to improve the accuracy of the resulting measurements.

DETAILED DESCRIPTION

Some of the challenges describe previously, as well as others, may be addressed using the apparatus, systems, and methods described herein. In many embodiments, a driver circuit topology for switching high power radio-frequency (RF) energy is realized in the form of an amplifier that makes use of metal-oxide semiconductor field-effect transistors (MOSFETs). The MOSFETS may be asymmetric gate-to-source MOSFETs, including silicon-carbide (SiC) MOSFETs. These devices are well-suited to use downhole, since they can survive high ambient temperature conditions.

To provide a more consistent use of terminology throughout this document, several specific terms and phrases are used. These are set apart with quotation marks, and defined below. After this list of definitions has been given, a more detailed description of the mechanisms used in several embodiments will be provided.

an "asymmetric gate-to-source MOSFET" refers to a MOSFET that has maximum gate-to-source voltage param-

2 eters that are not symmetric about zero volts, such as a worst case gate-to-source voltage range of −5V to +25V or −10V to +25V Examples of such devices may include SiC MOSFETs, such as those associated with model numbers CMF20120D and C2M0025120D, available from Cree, Inc. of Durham, N.C.

a "totem-pole series" refers to a complementary pair of semiconductor switching devices (e.g., a P Channel MOSFET and an N Channel MOSFET) connected drain-to-drain, directly or via some resistance, providing a signal output connection to one or both drains of the devices. A common input signal is directed to the gate of each device, each gate being referenced to a substantially fixed potential (which may or may not be the same for each gate).

a "floating power supply terminal" refers to a power supply terminal that is not grounded.

a "housing" includes any one or more of a drill collar, a down hole tool, or a wireline logging tool body (all having an outer surface, to enclose or attach to magnetometers, sensors, fluid sampling devices, pressure measurement devices, temperature measurement devices, transmitters, receivers, drivers, amplifiers, acquisition and processing logic, and data acquisition systems.

The SiC MOSFET can provide several advantages over more conventional switching devices, including a lower gate charge and low drain-to-source leakage current when exposed to a high ambient temperature environment. These features can enhance the usefulness of apparatus that employ the SiC MOSFET in downhole applications, including logging applications. For example, amplifier switching frequency that results when SiC MOSFETs are used may vary over a wide range, from less than 100 kHz, to well over 1 MHz. Thus, the controlled application of power at elevated temperatures, over a wide range of frequencies, may be realized.

However, the gate driver voltage selection for a SiC MOSFET may be different than what is used with more convention silicon MOSFETs. For example, when the SiC MOSFET is formed as an asymmetric gate-to-source MOSFET, the worst case gate-to-source voltage may range from −5V to 25V.

In this case, a new driver circuitry topology, such as a floating gate driver circuit topology, may be useful for bridged RF power amplifier applications. The resulting floating driver circuitry apparatus can be used to drive SiC MOSFETs in parallel, in a high power, full bridge RF amplifier configuration, which may in turn be used to power a variety of transducers.

Lab results indicate a power output of 16 KVA can be achieved. Moreover, the driver circuitry is simple and robust, with a low parts count that is easy to manufacture and maintain. The development and implementation of this topology, in the form of various embodiments that include some or all of these features, will now be described.

Figure 1:
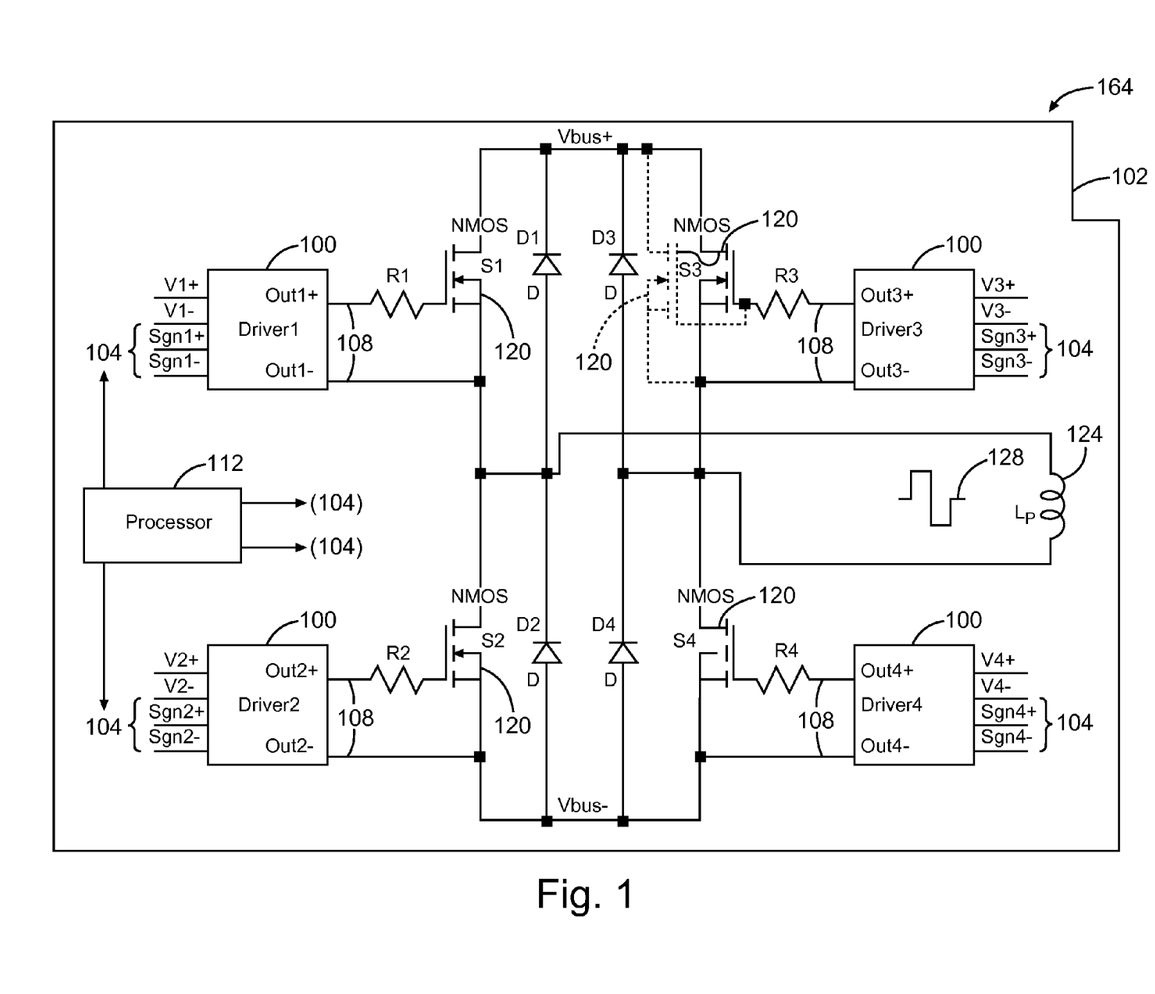
FIG. 1 is a block diagram of apparatus and systems according to various embodiments of the invention.

FIG. 1 is a block diagram of apparatus 100 and systems 164 according to various embodiments of the invention. Here an RF amplifier architecture can be seen, in which four floating drivers (e.g., the apparatus 100) are arranged to provide a useful circuit topology.

Thus, a system 164 can be made up of four driver apparatus 100, connected in a variety of ways. In FIG. 1, the driver apparatus 100 are coupled to a plurality of asymmetric gate-to-source MOSFETs 120, which are in turn connected to drive a common load 124. In some embodiments, a system 164 includes a housing 102. The housing 102 might take the form of a wireline tool body, or a down hole tool.

In the system 164 of FIG. 1, an RF switched-mode amplifier with a floating driver circuitry topology in accordance with some embodiments is shown. Each instance of the high side and low side driver circuitry topology, in the form of apparatus 100 (refer to FIG. 2 for details), can be identical. A modulated RF waveform can be applied as an input signal 104 to the apparatus 100. This results in switching parallel-connected MOSFETs S1, S2, S3, and S4, which are coupled to a common load 124, which may take the form of a transducer, such as an antenna. Thus, an amplified RF output signal 128 may be applied to the load 124. In some embodiments, processor(s) 112 within the system 164 may be located at the surface, as part of a surface logging facility, or downhole, attached to the housing 102, and used to provide the input signal 104.

Figure 2:
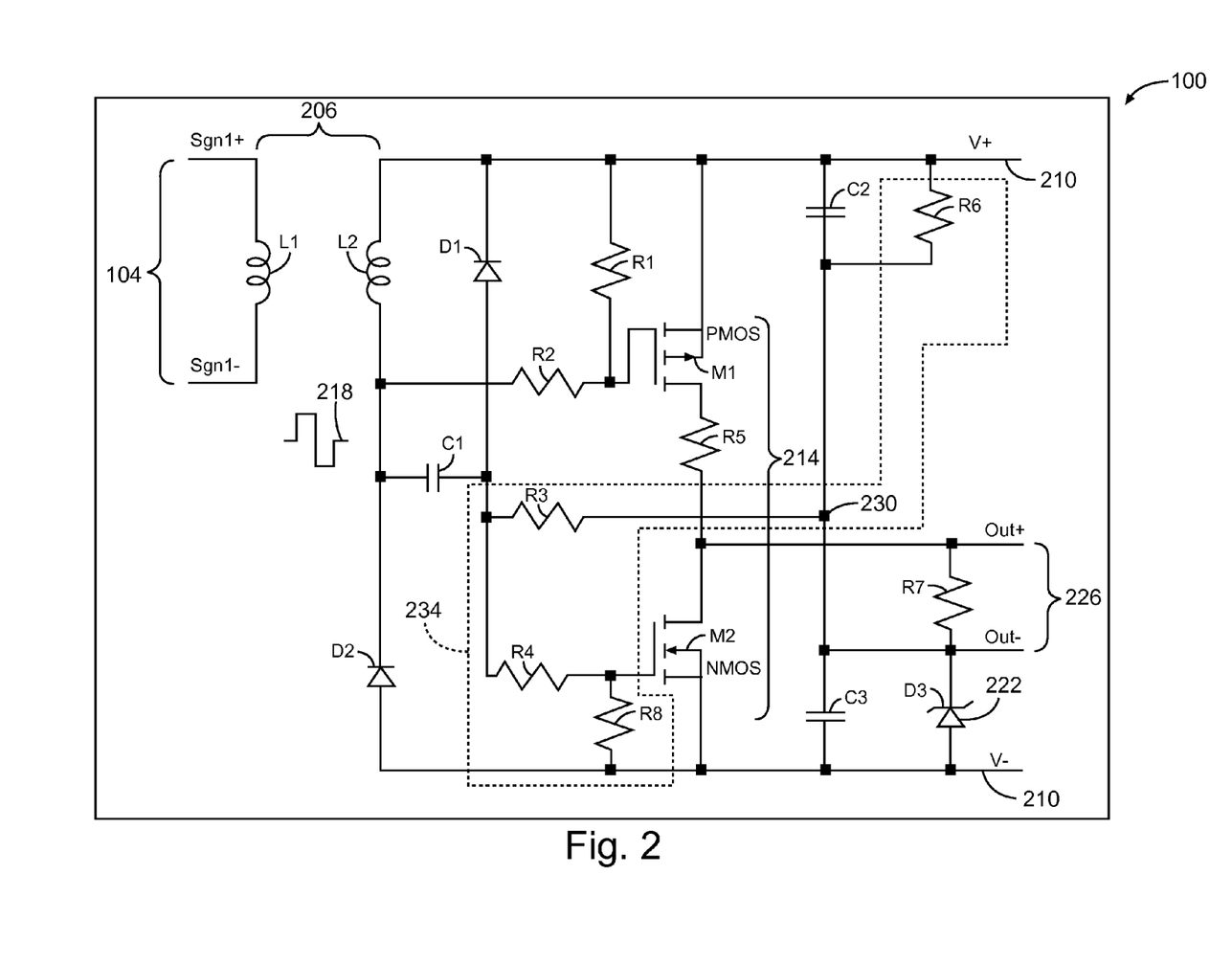
FIG. 2 is a schematic diagram of an apparatus according to various embodiments of the invention.

FIG. 2 is a schematic diagram of an apparatus 100 according to various embodiments of the invention. Here the switched mode amplifier driver circuitry topology can be seen, as it might be used to form the apparatus 100 (i.e., Driver 1, Driver 2, Driver 3, and Driver 4) of FIG. 1.

Referring now to FIGS. 1 and 2, it can be seen that two floating power supply terminal voltages V+ and V− provide the positive and negative electromotive force that is used to drive the MOSFETs 120 of FIG. 1 A direct current (DC)-biased pulse transformer 206 is used to isolate the modulated RF control signal provided as the input signal 104 from the high power section of the remaining circuitry. Resistors R6, R3, R4, and R8 in the network 234 deliver a DC-biased voltage to turn the N channel MOSFET M2 "ON" to provide a negative output signal 226 when a modulated RF control signal is not present at the input signal terminals Sgn+ and Sgn−.

Resistor R1 is used to keep P channel MOSFET M1 turned "OFF" until it receives a command (via the input signal 104) to turn "ON". Capacitor C1 is used as a level shift capacitor used to adjust the level of the modulated RF control signal as the input signal 104, to control the N channel MOSFET M2 with respect to the negative floating power supply terminal input V−. Diode D3, with a zener voltage of less than 5V and a negative temperature coefficient in some embodiments, is used to clamp the driver output voltage Out− to a negative voltage level meets the desired asymmetric gate-to-source voltage level. Capacitors C2 and C3 are coupled together to create a reference as a virtual ground node 230 for the circuit.

Figure 3:
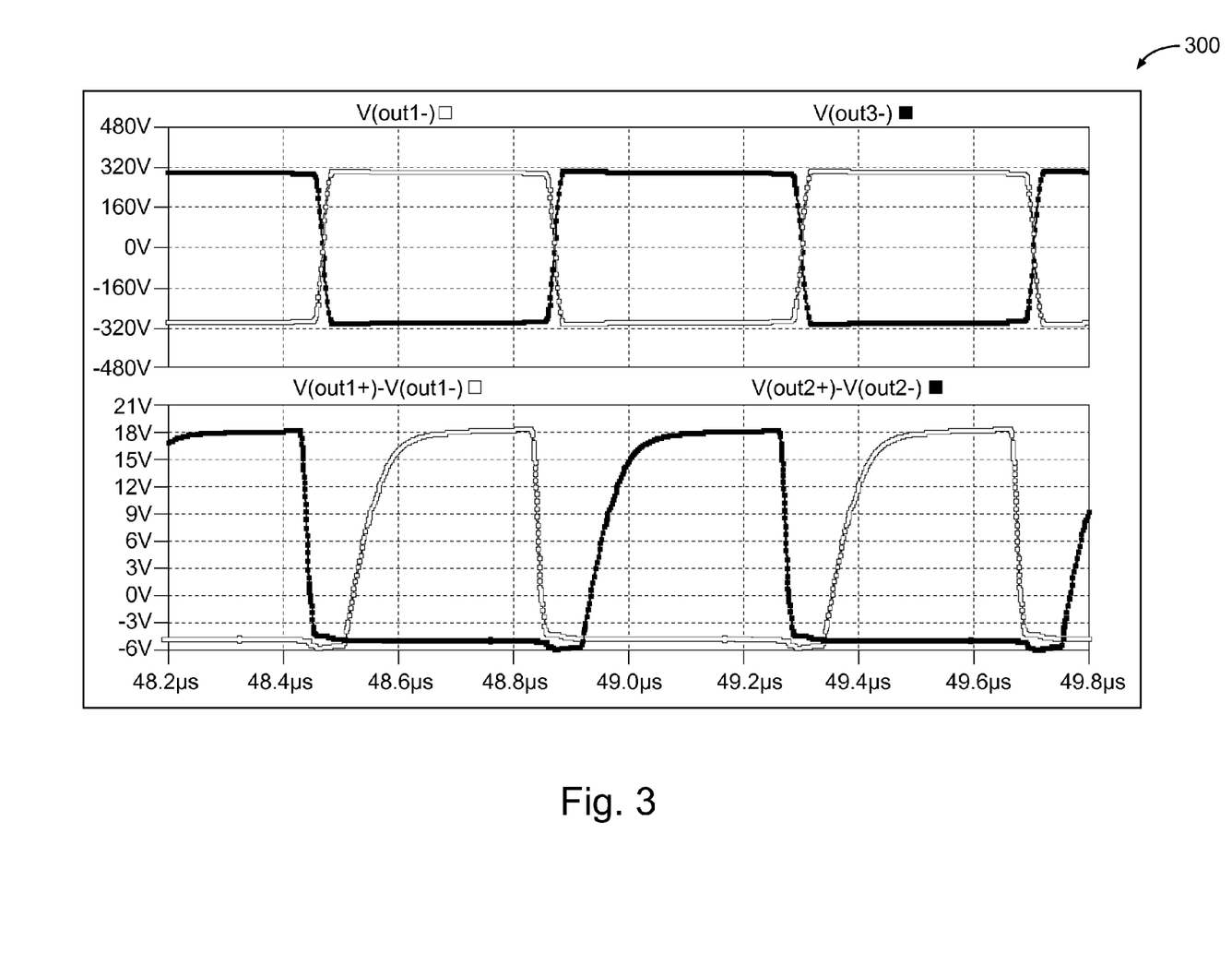
FIG. 3 includes a pair of graphs illustrating a 1.2 MHz switching frequency applied to the system of FIG. 1, according to various embodiments of the invention.

FIG. 3 includes a pair of graphs 300 illustrating a 1.2 MHz switching frequency applied to the system of FIG. 1, according to various embodiments of the invention. Here the output waveforms for Driver1 and Driver 2 can be seen.

Referring now to FIGS. 1-3, it should be understood that in many embodiments, the floating supply voltage for each instance of the apparatus 100 is provided by a separate supply. As a matter of contrast, the input signals Sgn1+/Sgn1− and Sgn2+/Sgn2− are often derived from a common source. Similarly, Sgn3+/Sgn3− and Sgn4+/Sgn4− may also be derived from a common source.

Assuming an embodiment that uses the latter type of dual-source, common drive to provide the input signals 104, the high and low side driver modulated RF input signal 104 voltage levels are coupled respectively positively and negatively to the isolation transformer 206, which in turn toggles the P channel MOSFET M1 "OFF" and the N channel MOSFET M2 "ON" within the totem-pole series shown in FIG. 2. The resulting high side driver circuit output is shown in FIG. 3 as V(vgate1)-V(vh1), with the low side driver circuit output as V(vgate2)-V(n045). Here the dead time is about 60 nanoseconds when a switching frequency of 1.2 MHz is applied, under control of the rising and falling edge of the coupled voltage signal 218 provided by the isolation transformer 206, determined by the combination of resistors R2 and R4.

The signals V(vh1) and V(vh2) represent the full bridge output voltage when a +/−300V DC bus voltage is used. The driving current flows locally from the V+ floating power supply terminal 210 to the MOSFET 120 gate and source for the stage that is turned "ON" stage, and from the MOSFET 120 source and gate to the V− floating supply input terminal 210 for the stage that is turned "OFF".

Figure 4:
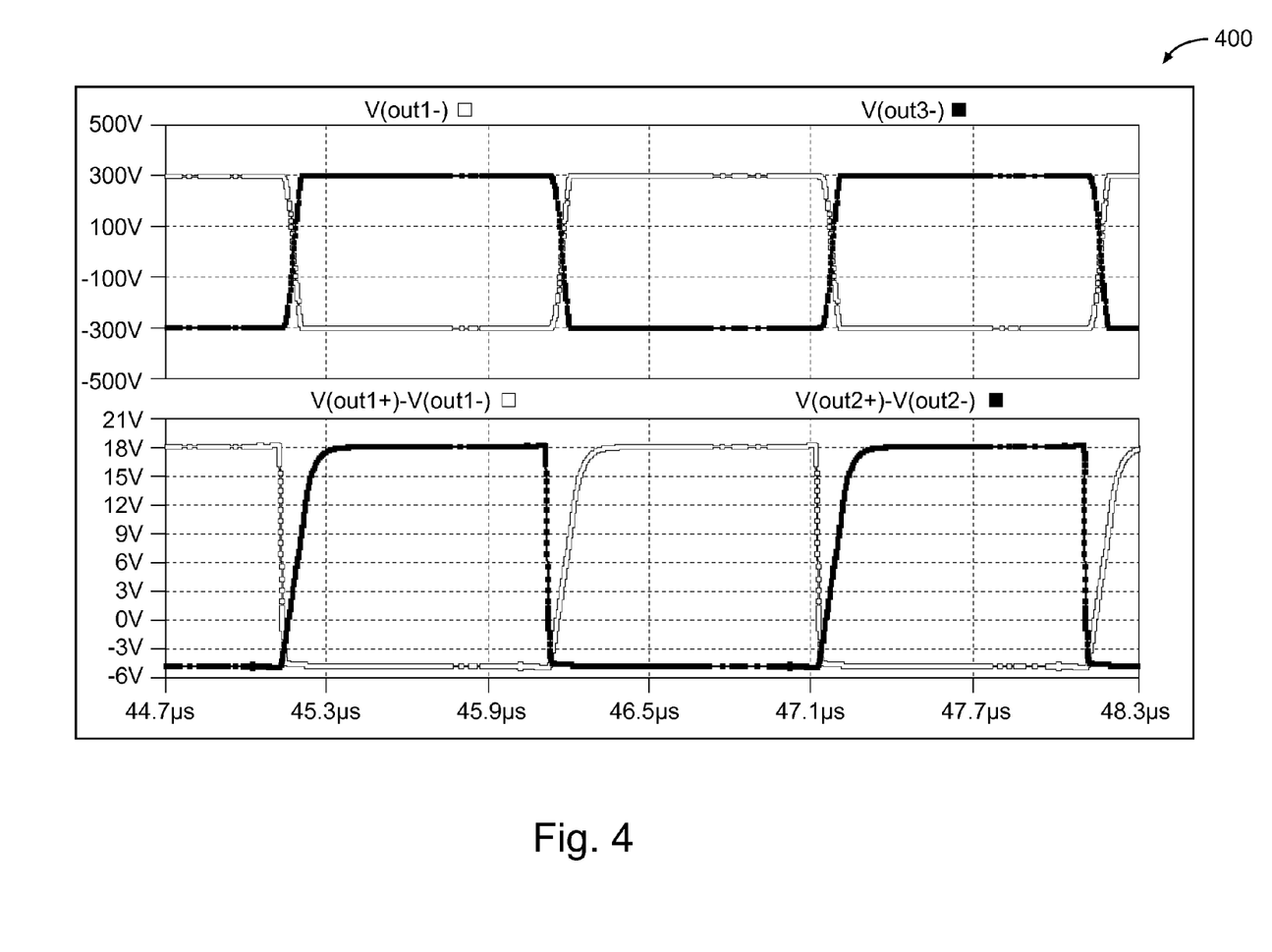
FIG. 4 includes a pair of graphs illustrating a 500 kHz switching frequency applied to the system of FIG. 1, according to various embodiments of the invention.

FIG. 4 includes a pair of graphs 400 illustrating a 500 kHz switching frequency applied to the system of FIG. 1, according to various embodiments of the invention. Here the output waveforms for Driver 1 and Driver 2 can be seen.

Referring now to FIGS. 1-2 and 4, and assuming the use of dual-source, common drive to provide the input signals 104, the high and low side driver modulated RF signal input signal 104 voltage levels are coupled respectively negatively and positively to the isolation transformer 206, which in turn toggles the P channel MOSFET M1 "ON" and the N channel MOSFET M2 "OFF" within the totem-pole series shown in FIG. 2. The resulting high side driver circuit output is shown in FIG. 4 as V(vgate1)-V(vh1), with the low side driver circuit output as V(vgate2)-V(n045). Here the dead time is about 50 nanoseconds when a switching frequency of 500 kHz is applied, under control of the rising and falling edge of the coupled voltage signal 218 provided by the isolation transformer 206.

The signals V(vh1) and V(vh2) represent the full bridge output voltage when a +/−300V DC bus voltage is used. Here again, the driving current flows locally from the V+ floating power supply terminal 210 to the MOSFET 120 gate and source for the stage that is turned "ON" stage, and from the MOSFET 120 source and gate to the V− floating power supply terminal 210 for the stage that is turned "OFF".

Thus, referring now to FIGS. 1-2, it can be seen that many embodiments may be realized. For example, an apparatus 100 may comprise a transformer 206, floating power supply terminals 210, MOSFETs M1, M2 connected as a totem-pole series 214, and a clamping device 222. Thus, a driver apparatus 100 may include a transformer 206 to receive a first control signal 104 and a direct current (DC) bias voltage V+. The apparatus 100 may further include floating power supply terminals 210 to receive at least a portion of the DC bias voltage V+. In many embodiments, the apparatus 100 includes a totem-pole series 214 of driver MOSFETs M1, M2, wherein the floating power supply terminals 210 are to supply opposing ends of the totem-pole series 214, and wherein the transformer 206, in response to the first control signal 104, provides a second control signal 218 to control current flow through the driver MOSFETs M1, M2. In many embodiments, the apparatus 100 also includes a clamping device 222 to clamp an output Out− of the driver apparatus 100 to one of the floating power supply terminals 210.

The clamping device 222 may be used to clamp the driver apparatus output Out− to one of the floating power supply terminals 210. Thus, in some embodiments, the clamping device 222 clamps the output of the driver apparatus Out− to a negative one of the floating power supply terminals 210.

The clamping device 222 may comprise a zener diode alone, other elements, or a zener diode in conjunction with other elements. The clamping device 222 may be biased, as occurs with resistor R6 in FIG. 2. Thus, in some embodiments, the apparatus 100 may include a resistor R6 to bias a zener diode D3 that is used as a clamping device 222.

An artificial ground node 230 may be created between the floating power supply terminals 210, and the clamping device 222 may be connected to the node 230. Thus, in some embodiments, the clamping device 222 is directly coupled to an artificial ground node 230 that exists between the floating power supply terminals 210.

The apparatus 100 may include a network 234 of circuit elements, perhaps comprising a set of resistors that operate to provide voltage at the output 226 of the driver apparatus 100 when there is no control signal 104 present at the input terminals of the transformer 206. Thus, in some embodiments, the apparatus 100 comprises a resistor network 234 to provide a fixed output voltage at an output 226 of the driver apparatus 100 when the control signal 104 is not present at input terminals Sgn+, Sgn− of the transformer 206.

A capacitor, or some other circuit element(s), may be used to shift the voltage level between the output of the transformer 206 (e.g., across coil L2) and the input of the network 234 of circuit elements. Thus, in some embodiments, the apparatus 100 comprises a level shifting capacitor C1 to AC-couple the transformed control signal 218 to the resistor network 234.

The driver apparatus 100 may be housed by a wireline tool, or a down hole tool, including a down hole sub. Thus, in some embodiments, the apparatus 100 may be mechanically coupled to a housing 102, wherein the housing forms a portion of a wireline tool or a down hole tool, such as a logging while drilling tool or a measurement while drilling tool, among others.

System embodiments can also be realized. For example, in some embodiments, a system 164 may comprise four driver apparatus 100, connected in a variety of ways. The driver apparatus 100 may be coupled to a plurality of asymmetric gate-to-source MOSFETs 120, connected to drive a common load 124. Thus, a system 164 may comprise four symmetrically coupled driver apparatus 100, to receive multiple control signals 104, and to provide corresponding driver outputs 226 to at least four asymmetric gate-to-source MOSFETs 120 that are electrically connected to drive a common load 124. Each of the driver apparatus 100 may be constructed in any of the ways described herein. As noted previously the asymmetric gate-to-source MOSFETS may comprise SiC MOSFETs.

The MOSFETs 120 may comprise multiple transistors operating in parallel. Thus, in some embodiments, each one of the asymmetric gate-to-source MOSFETs 120 may comprise at least two transistors connected to operate in parallel (e.g., as shown by the dashed line parallel configuration of MOSFETs S3).

The driver apparatus 100 may be connected to operate in a full-wave bridge configuration. Thus, in some embodiments, the four symmetrically coupled driver apparatus 100 are connected in a full-wave bridge configuration.

The system 164 may be used to drive many kinds of loads 124, including one or more antennas. Thus, in some embodiments, the common load 124 comprises one or more antennas.

Some of the driver apparatus 100 within the system 164 may be connected to a bus supply voltage of positive polarity, and others may be connected to a bus supply voltage of negative polarity. Thus, in some embodiments, two of the four symmetrically coupled driver apparatus 100 are coupled to a positive bus supply voltageVbus+, and two of the four symmetrically coupled driver apparatus 100 are coupled to a negative bus supply voltage Vbus− that is less than the positive bus supply voltage Vbus+.

In the system 164, the processor 112 may be housed by the housing 102, or by a surface processing facility 156, or both, depending on where various calculations are to be made, and where signals are generated. Thus, processing and signal generation during various activities conducted by the system 164 may be conducted both downhole and at the surface. In this case, the processor 112 may comprise multiple computational units, some located downhole, and some at the surface. Further embodiments may be realized, and thus, some additional examples of systems will now be described.

Figure 5:
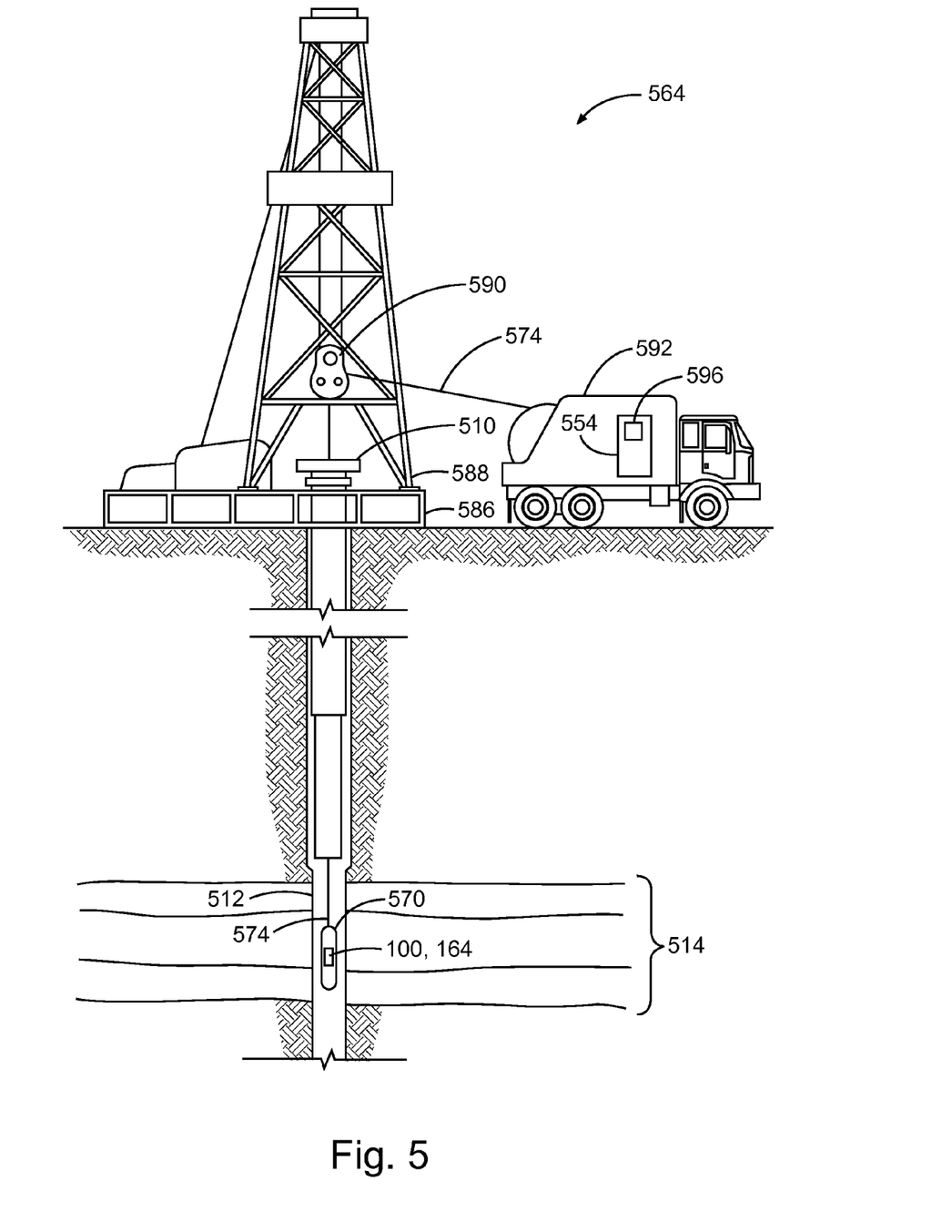
FIG. 5 illustrates a wireline system embodiment of the invention.
Figure 6:
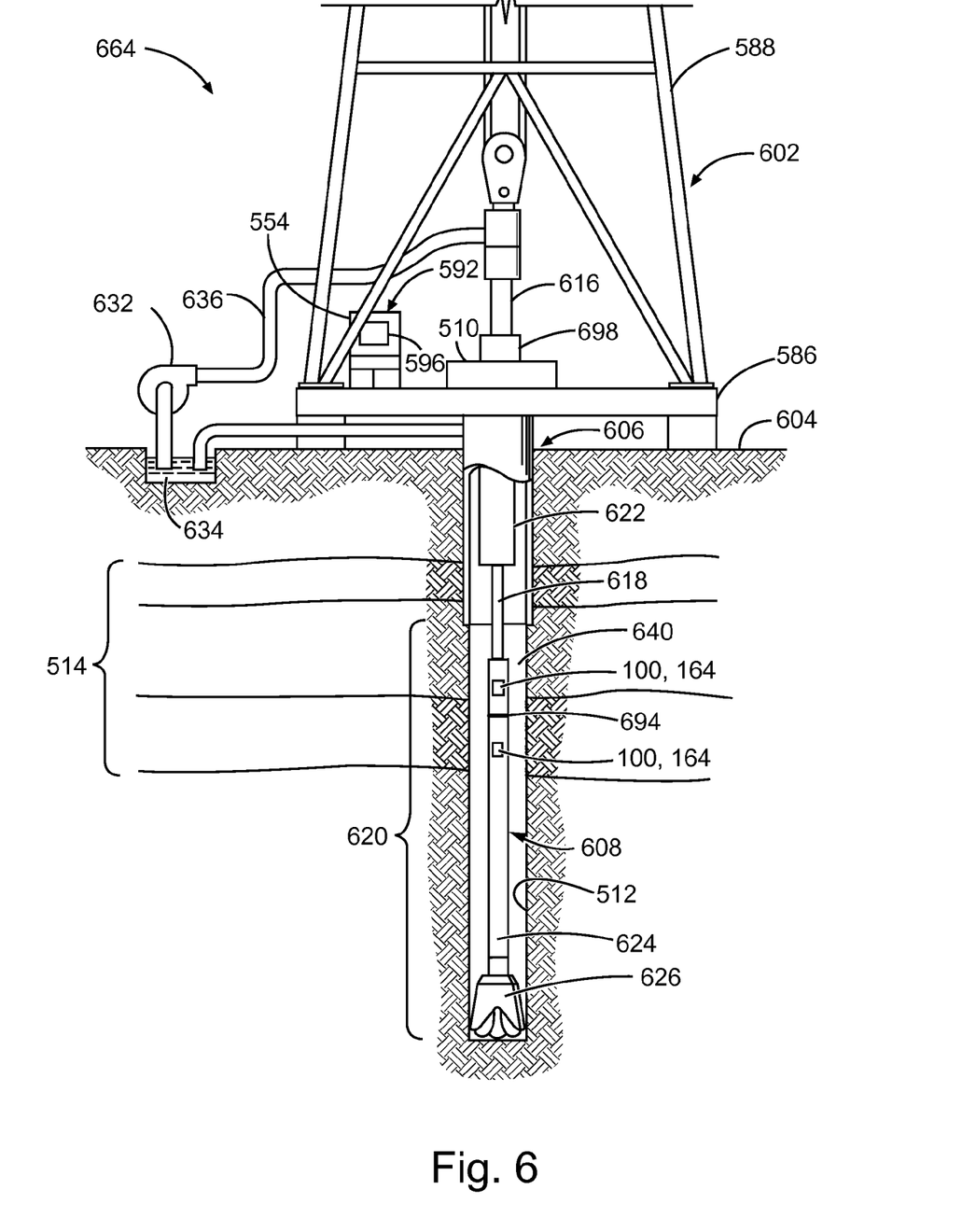
FIG. 6 illustrates a drilling rig system embodiment of the invention.

FIG. 5 illustrates a wireline system 564 embodiment of the invention, and FIG. 6 illustrates a drilling rig system 664 embodiment of the invention. Therefore, the systems 564, 664 may comprise portions of a wireline logging tool body 570 as part of a wireline logging operation, or of a down hole tool 624 as part of a down hole drilling operation. The systems 564 and 664 may include any one or more elements of the system 164 shown in FIG. 1.

Thus, FIG. 5 shows a well during wireline logging operations. In this case, a drilling platform 586 is equipped with a derrick 588 that supports a hoist 590.

Drilling oil and gas wells is commonly carried out using a string of drill pipes connected together so as to form a drilling string that is lowered through a rotary table 510 into a wellbore or borehole 512. Here it is assumed that the drilling string has been temporarily removed from the borehole 512 to allow a wireline logging tool body 570, such as a probe or sonde, to be lowered by wireline or logging cable 574 into the borehole 512. Typically, the wireline logging tool body 570 is lowered to the bottom of the region of interest and subsequently pulled upward at a substantially constant speed.

During the upward trip, at a series of depths, various instruments included in the tool body 570 may be used to perform measurements (e.g., assisted by the presence of the apparatus 100 shown in FIGS. 1 and 2, providing the controlled application of power to a variety of transducers) on the subsurface geological formations 514 adjacent the borehole 512 (and the tool body 570). The borehole 512 may represent one or more offset wells, or a target well.

The measurement data can be communicated to a surface logging facility 592 for processing, analysis, and/or storage. The logging facility 592 may be provided with electronic equipment for various types of signal processing, which may be implemented by any one or more of the components of the apparatus 100 or system 164 in FIG. 1. Similar formation evaluation data may be gathered and analyzed during drilling operations (e.g., during logging while drilling operations, and by extension, sampling while drilling).

In some embodiments, the tool body 570 is suspended in the wellbore by a wireline cable 574 that connects the tool to a surface control unit (e.g., comprising a workstation 554). The tool may be deployed in the borehole 512 on coiled tubing, jointed drill pipe, hard wired drill pipe, or any other suitable deployment technique.

Turning now to FIG. 6, it can be seen how a system 664 may also form a portion of a drilling rig 602 located at the surface 604 of a well 606. The drilling rig 602 may provide support for a drill string 608. The drill string 608 may operate to penetrate the rotary table 510 for drilling the borehole 612 through the subsurface formations 514. The drill string 608 may include a Kelly 616, drill pipe 618, and a bottom hole assembly 620, perhaps located at the lower portion of the drill pipe 618.

The bottom hole assembly 620 may include drill collars 622, a down hole tool 624, and a drill bit 626. The drill bit 626 may operate to create the borehole 512 by penetrating the surface 604 and the subsurface formations 514. The down hole tool 624 may comprise any of a number of different types of tools including measurement while drilling tools, logging while drilling tools, and others.

During drilling operations, the drill string 608 (perhaps including the Kelly 616, the drill pipe 618, and the bottom hole assembly 620) may be rotated by the rotary table 510. Although not shown, in addition to, or alternatively, the bottom hole assembly 620 may also be rotated by a motor (e.g., a mud motor) that is located down hole. The drill collars 622 may be used to add weight to the drill bit 626. The drill collars 622 may also operate to stiffen the bottom hole assembly 620, allowing the bottom hole assembly 620 to transfer the added weight to the drill bit 626, and in turn, to assist the drill bit 626 in penetrating the surface 604 and subsurface formations 514.

During drilling operations, a mud pump 632 may pump drilling fluid (sometimes known by those of ordinary skill in the art as "drilling mud") from a mud pit 634 through a hose 636 into the drill pipe 618 and down to the drill bit 626. The drilling fluid can flow out from the drill bit 626 and be returned to the surface 604 through an annular area between the drill pipe 618 and the sides of the borehole 512. The drilling fluid may then be returned to the mud pit 634, where such fluid is filtered. In some embodiments, the drilling fluid can be used to cool the drill bit 626, as well as to provide lubrication for the drill bit 626 during drilling operations. Additionally, the drilling fluid may be used to remove subsurface formation cuttings created by operating the drill bit 626.

Thus, referring now to FIGS. 1-2 and 5-6, it may be seen that in some embodiments, the systems 564, 664 may include a drill collar 622, a down hole tool 624, and/or a wireline logging tool body 570 to house one or more apparatus 100, similar to or identical to the apparatus 100 described above and illustrated in FIG. 2. Any and all components of the system 164 in FIG. 1 may also be housed by the tool body 570 or the tool 624.

The wireline tool body 570 may comprise a wireline logging tool, including a probe or sonde, for example, coupled to a logging cable 574. The tool 624 may comprise a down hole tool, such as a logging while drilling (LWD) tool or measurement while drilling (MWD) tool. Many embodiments may thus be realized.

It should also be understood that the apparatus and systems of various embodiments can be used in applications other than for logging operations, and thus, various embodiments are not to be so limited. The illustrations of apparatus 100 and systems 164, 564, 664 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Such apparatus and systems may further be included as sub-components within a variety of electronic systems, such as televisions, cellular telephones, personal computers, workstations, radios, video players, vehicles, signal processing for geothermal tools and smart transducer interface node telemetry systems, among others. Some embodiments include a number of methods.

Figure 7:
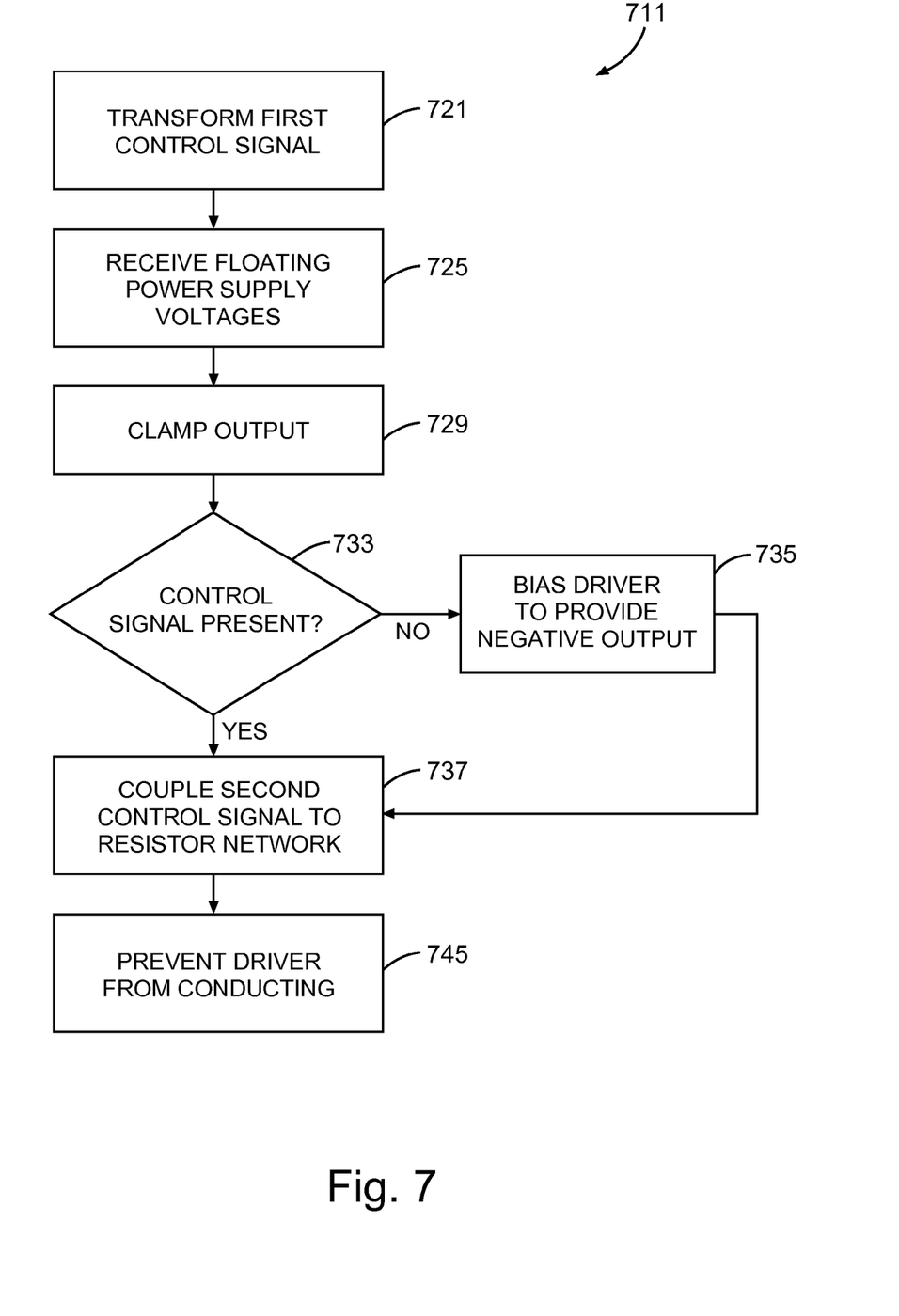
FIG. 7 is a flow chart illustrating several additional methods according to various embodiments of the invention.

For example, FIG. 7 is a flow chart illustrating several additional methods 711 according to various embodiments of the invention. The method 711 may comprise processor-implemented methods, to execute on one or more processors that perform the methods. The methods 711 may be applied to a number of configurations of the apparatus 100 and system 164 shown in FIG. 1. For example, in some embodiments, a method 711 includes operating a driver apparatus to transform a control signal (see block 721), to regulate current flowing through a totem-pole series of MOSFETs that are connected to a pair of floating power supply voltages (e.g., see blocks 725, 737, and 745). The output of the driver apparatus may be clamped to one of the pair of floating power supply voltages (see block 729).

One embodiment of a method 711 may begin at block 721 with transforming a first control signal to produce an isolated second control signal. The method 711 may continue on to block 725, to include receiving a pair of floating power supply voltages at opposing ends of a totem-pole series of driver MOSFETs. The isolated second control signal may operate to control current flow through the driver MOSFETs.

The method 711 may further include clamping the output of a driver apparatus to one of the pair of floating power supply voltages at block 729. In this case, the clamping device coupled to the driver apparatus output can be connected to a virtual ground node that exists between the pair of floating power supply voltages. Thus, the activity at block 729 may comprise clamping the output of the driver apparatus using a clamping device coupled to a virtual ground node between the pair of floating power supply voltages.

When a control signal is not provided to the driver apparatus, one or more of the MOSFETs can be biased to provide a negative voltage at the output of the apparatus. Thus, in some embodiments, when it is determined that no control signal is present at block 733, the method 711 may continue on to block 735 with biasing one of the driver MOSFETs to provide a negative voltage at a driven output of the driver apparatus when the first control signal is absent.

The bias voltage that provides a driver output when no control voltage is present can be derived from the floating power supply voltages. Thus, in some embodiments, the activity at block 735 may comprise deriving a bias voltage from the pair of floating power supply voltages using a fixed resistor network.

A DC level-shifting circuit may be used to couple the transformer output (i.e., an isolated second control voltage) to a network circuit, where the network circuit is used to provide the bias voltage. Thus, the method 711 may include coupling the isolated second control voltage to the fixed resistor network through a DC level-shifting component at block 737.

One or more of the MOSFETs can be controlled, so as not to conduct current, by coupling its gate to one of the pair of floating power supply voltages. Thus, the method 711 may include, at block 745, preventing one of the driver MOSFETs from conducting current by coupling the gate to a positive one of the pair of floating power supply voltages.

It should be noted that the methods described herein do not have to be executed in the order described, or in any particular order. Moreover, various activities described with respect to the methods identified herein can be executed in iterative, serial, or parallel fashion. The various elements of each method (e.g., the methods shown in FIG. 7) can be substituted, one for another, within and between methods.

Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 8:
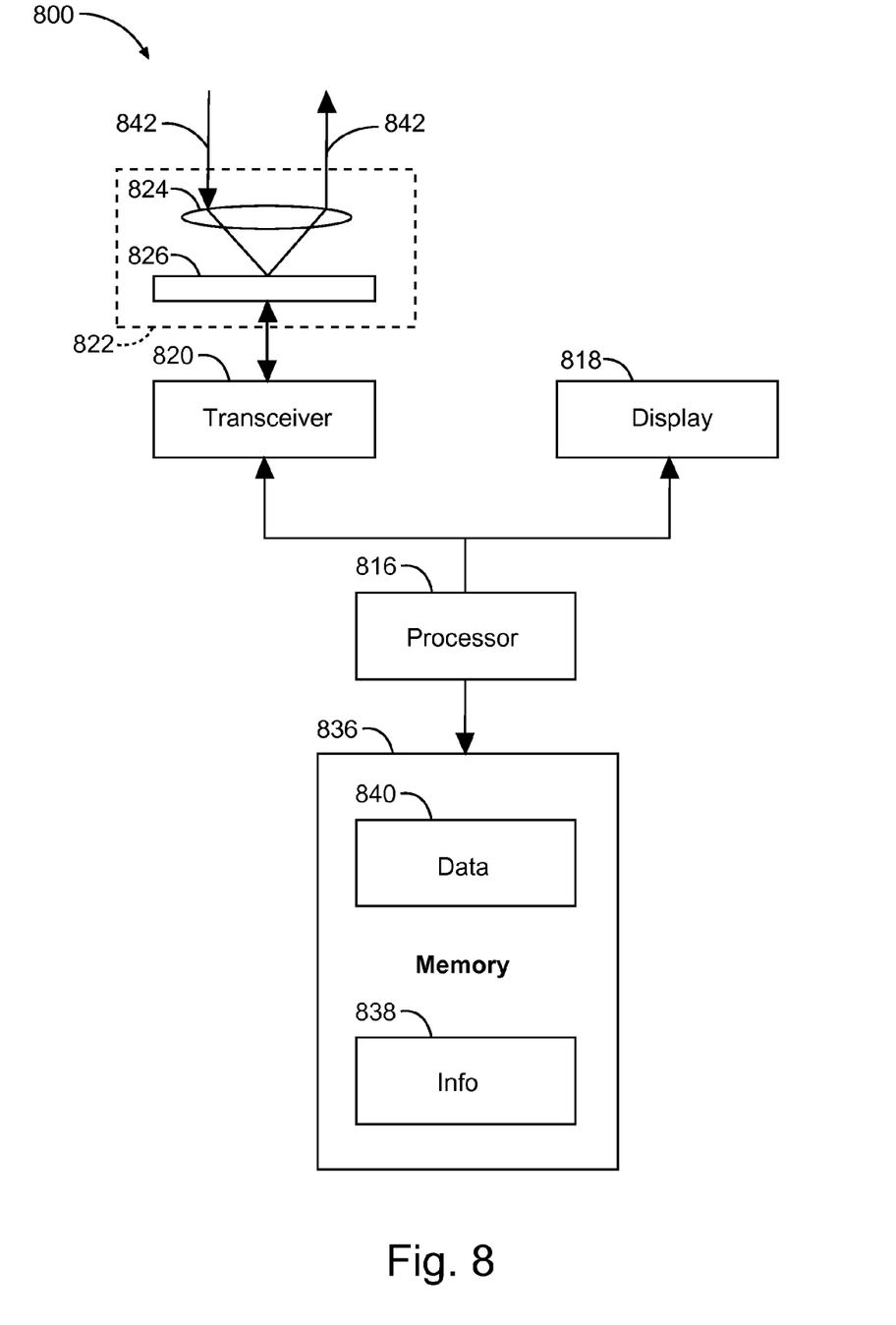
FIG. 8 is a block diagram of an article according to various embodiments of the invention.

For example, FIG. 8 is a block diagram of an article 800 of manufacture according to various embodiments, such as a computer, a memory system, a magnetic or optical disk, or some other storage device. The article 800 may include one or more processors 816 coupled to a machine-accessible medium such as a memory 836 (e.g., removable storage media, as well as any tangible, non-transitory memory including an electrical, optical, or electromagnetic conductor having associated information 838 (e.g., computer program instructions and/or data), which when executed by one or more of the processors 816, results in a machine (e.g., the article 800) performing any of the actions described with respect to the methods of FIG. 7, and the systems of FIGS. 1, 5, and 6. The processors 816 may comprise one or more processors sold by Intel Corporation (e.g., Intel® Core™ processor family), Advanced Micro Devices (e.g., AMD Athlon™ processors), and other semiconductor manufacturers. The article 800 may be included as part of the processor(s) 112, shown in FIG. 1.

In some embodiments, the article 800 may comprise one or more processors 816 coupled to a display 818 to display data processed by the processor 816 and/or a wireless transceiver 820 (e.g., a down hole telemetry transceiver) to receive and transmit data processed by the processor.

The memory system(s) included in the article 800 may include memory 836 comprising volatile memory (e.g., dynamic random access memory) and/or non-volatile memory. The memory 836 may be used to store data 840 processed by the processor 816, including control signal waveforms that are used to provide input signals to the apparatus and systems described herein.

In various embodiments, the article 800 may comprise communication apparatus 822, which may in turn include amplifiers 826 (e.g., preamplifiers or power amplifiers) and one or more transducers 824 (e.g., transmitting and/or receiving devices, such as acoustic transducers, or antennas). Signals 842 received or transmitted by the communication apparatus 822 may be processed according to the methods described herein.

Many variations of the article 800 are possible. For example, in various embodiments, the article 800 may comprise a down hole tool, including any one or more elements of the system 164 shown in FIG. 1.

In summary, the apparatus, systems, and methods disclosed herein provide a circuit topology that can be used to drive SiC MOSFETs in half and full bridge RF amplifier configurations, even with asymmetric gate-to-source voltages, over a wide bandwidth. SiC MOSFETs may be coupled in parallel to make use of common drive signals, with strong current sink and source capability (e.g., 20 A). The circuit topology is suitable for high side or low side drive in half and full bridge RF amplifiers, with high isolation capability between the driving signal and the high power bridge. Peak currents of 140A and DC bus voltages of 600V may be realized, even when switching frequencies exceed 1 MHz, and operating temperatures approach 175 C. As a result, the value of services provided by a downhole operation/exploration company may be significantly enhanced.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:
1. A driver apparatus, comprising:
   a transformer to receive a first control signal and a direct current (DC) bias voltage;
   floating power supply terminals to receive at least a portion of the DC bias voltage;

a totem-pole series of driver metal-oxide semiconductor field-effect transistors (MOSFETs), wherein the floating power supply terminals are to supply opposing ends of the totem-pole series, and wherein the transformer, in response to the first control signal, provides a second control signal to control current flow through the driver MOSFETs; and a clamping device to clamp an output of the driver apparatus to one of the floating power supply terminals.

2. The driver apparatus of claim 1, wherein the clamping device clamps the output of the driver apparatus to a negative one of the floating power supply terminals.

3. The driver apparatus of claim 1, wherein the clamping device is directly coupled to an artificial ground node that exists between the floating power supply terminals.

4. The driver apparatus of claim 1, wherein the clamping device comprises a zener diode.

5. The driver apparatus of claim 4, further comprising:
a resistor to bias the zener diode.

6. The driver apparatus of claim 1, further comprising:
a resistor network to provide a fixed output voltage at an output of the driver apparatus when the first control signal is not present at input terminals of the transformer.

7. The driver apparatus of claim 6, further comprising:
a level shifting capacitor to AC-couple the second control signal to the resistor network.

8. The driver apparatus of claim 1, mechanically coupled to a housing that forms a portion of a wireline tool or a down hole tool.

9. A method, comprising:
transforming a first control signal to produce an isolated second control signal;
receiving a pair of floating power supply voltages at opposing ends of a totem-pole series of driver metal-oxide semiconductor field-effect transistors (MOSFETs), wherein the isolated second control signal operates to control current flow through the driver MOSFETs; and
clamping an output of a driver apparatus to one of the pair of floating power supply voltages.

10. The method of claim 9, further comprising:
biasing one of the driver MOSFETs to provide a negative voltage at a driven output of the driver apparatus when the first control signal is absent.

11. The method of claim 10, wherein the biasing comprises:
deriving a bias voltage from the pair of floating power supply voltages using a fixed resistor network.

12. The method of claim 11, further comprising:
coupling the isolated second control voltage to the fixed resistor network through a direct current (DC) level-shifting component.

13. The method of claim 9, wherein another one of the driver MOSFETs has a gate, further comprising:
preventing the other one of the driver MOSFETs from conducting current by coupling the gate to a positive one of the pair of floating power supply voltages.

14. The method of claim 9, wherein the clamping comprises:
clamping the output of the driver apparatus using a clamping device coupled to a virtual ground node between the pair of floating power supply voltages.

15. A system, comprising:
four symmetrically coupled driver apparatus, to receive multiple control signals, and to provide corresponding driver outputs to at least four asymmetric gate-to-source metal-oxide semiconductor field-effect transistors (MOSFETs) electrically connected to drive a common load, wherein each of the driver apparatus comprise a transformer to receive a first control signal and a direct current (DC) bias voltage, floating power supply terminals to receive at least a portion of the DC bias voltage, a totem-pole series of driver MOSFETs, and a clamping device to clamp an output of the driver apparatus to one of the floating power supply terminals, wherein the floating power supply terminals are to supply opposing ends of the totem-pole series, wherein the transformer, in response to the first control signal, provides a second control signal to control current flow through the driver MOSFETs.

16. The system of claim 15, wherein the asymmetric gate-to-source MOSFETs comprise silicon carbide MOSFETs.

17. The system of claim 15, wherein each one of the asymmetric gate-to-source MOSFETs comprises at least two transistors connected to operate in parallel.

18. The system of claim 15, wherein the four symmetrically coupled driver apparatus are connected in a full-wave bridge configuration.

19. The system of claim 15, wherein the common load comprises an antenna.

20. The system of claim 15, wherein two of the four symmetrically coupled driver apparatus are coupled to a positive bus supply voltage, and wherein two of the four symmetrically coupled driver apparatus are coupled to a negative bus supply voltage that is less than the positive bus supply voltage.

* * * * *